United States Patent
Yang et al.

(10) Patent No.: US 11,515,343 B2
(45) Date of Patent: Nov. 29, 2022

(54) IMAGE SENSOR (71) Applicant: SK hynix Inc., Icheon-si (KR)

(72) Inventors: Yun Hui Yang, Cheongju-si (KR); Sung Hoon Jeon, Icheon-si (KR)

(73) Assignee: SK hynix In., Icheon-si (KR)

( * ) Notice: Subject to any disclaimer, the term of this patent is extended or adjusted under 35 U.S.C. 154(b) by 148 days.

(21) Appl. No.: 16/839,921

(22) Filed: Apr. 3, 2020

(65) Prior Publication Data
US 2021/0066359 A1   Mar. 4, 2021

(30) Foreign Application Priority Data

Aug. 26, 2019  (KR) .................. 10-2019-0104471

(51) Int. Cl.
*H01L 27/146* (2006.01)

(52) U.S. Cl.
CPC .... *H01L 27/14605* (2013.01); *H01L 27/1463* (2013.01); *H01L 27/14621* (2013.01)

(58) Field of Classification Search
None
See application file for complete search history.

(56) References Cited

U.S. PATENT DOCUMENTS

| | | | |
|---|---|---|---|
| 8,507,964 B2 | 8/2013 | Nozaki et al. | |
| 10,236,315 B2 | 3/2019 | Ooka et al. | |
| 2014/0111664 A1* | 4/2014 | Kumano | H01L 27/1464 348/222.1 |
| 2017/0047371 A1* | 2/2017 | Lee | H01L 27/14643 |
| 2017/0062496 A1* | 3/2017 | Lai | H01L 27/1464 |
| 2018/0053796 A1* | 2/2018 | Baek | H01L 27/1463 |
| 2019/0157329 A1* | 5/2019 | Kim | H01L 27/14621 |

\* cited by examiner

*Primary Examiner* — Ali Naraghi
(74) *Attorney, Agent, or Firm* — Perkins Coie LLP (57) ABSTRACT

Designs of image sensors including a plurality of first gild structures arranged in row and column directions of a pixel array of imaging pixels and structured to separate the imaging pixels from one another, each of the first grid structures including an air to provide optical isolation between two adjacent imaging pixels and a plurality of second grid structures respectively disposed at each intersection between the row direction and the column direction in which the first grid structures are arranged.

20 Claims, 10 Drawing Sheets

IMAGE SENSOR

CROSS-REFERENCES TO RELATED APPLICATION

The present application claims the priority and benefits of Korean application number 10-2019-0104471, filed on Aug. 26, 2019, which is incorporated herein by reference in its entirety as part of the disclosure of this patent document.

TECHNICAL FIELD

Various embodiments of the disclosed technology generally relate to an image sensor including color filters disposed adjacent to each other.

BACKGROUND

An image sensor refers to a semiconductor device for capturing an optical image to covert that optical image into electrical signals. The development of automotive, medical, computer, and communication industries is leading to an increase in the demand for enhanced image sensors in various devices such as smart phones, digital cameras, game machines, IOT (Internet of Things), robots, security cameras and medical micro-cameras.

The most common types of image sensors are charge coupled device (CCD) image sensors and complementary metal oxide semiconductor (CMOS) image sensors. CCD image sensors have advantages over the CMOS image sensor in terms of noise characteristics and image quality. However, CMOS image sensors are now widely used due to certain advantages over the CCD counterparts, including, e.g., higher frame rates and shutter speed. Furthermore, the CMOS image sensors and signal processing circuitry can be integrated into a single chip, making it possible to miniaturize electronic devices while achieving low power consumption. In addition, the CMOS process technology can enable low cost fabrication processes. Such characteristics of CMOS image sensors make these sensors better suited for implementations in mobile devices.

SUMMARY

The embodiments of the disclosed technology, among other features and benefits, relate to an image sensor capable of maintaining the stability of an air grid structure, even when air pressure is increased in the image sensor and in the air grid structure.

In an embodiment, an image sensor may include a plurality of first grid structures arranged in row and column directions of a pixel array of imaging pixels and structured to separate the imaging pixels from one another, each of the first grid structures including an air to provide optical isolation between two adjacent imaging pixels, and a plurality of second grid structures respectively disposed at each intersection between the row direction and the column direction in which the first grid structures are arranged.

In an embodiment, an image sensor may include a plurality of first grid structures arranged in row and column directions of a pixel array of imaging pixels and structured to separate the imaging pixels from one another, each of the first grid structures including a low-index material to provide optical isolation between two adjacent imaging pixels, and a plurality of second grid structures respectively disposed at each intersection between the row direction and the column direction in which the first grid structures are arranged.

In an embodiment, an image sensor may include a plurality of first grid structures formed between adjacent unit pixels included in a pixel array and arranged along one side of each unit pixel, the plurality of first grid structures configured to separate the adjacent unit pixels from one another, each of the first grid structures including an air to provide optical isolation between two adjacent unit pixels, and a plurality of second grid structures, each second grid structure disposed between two adjacent first grid structures arranged in a row or column direction of the pixel array.

In an embodiment, an image sensor may include a plurality of first grid structures formed between adjacent unit pixels included in a pixel array and arranged along one side of each unit pixel, the plurality of first grid structures configured to separate the adjacent unit pixels from one another, each of the first grid structures including a low-index material to provide optical isolation between two adjacent unit pixels, and a plurality of second grid structures, each second grid structure disposed between two adjacent first grid structures arranged in a row or column direction of the pixel array.

In an embodiment, an image sensor may include: a plurality of first grids arranged in a row or column direction of a pixel array; and a second grid disposed at each intersection between the row direction and the column direction.

Each of the first grids may be extended along one side of a unit pixel corresponding to the first grid.

A color filter may be disposed between the first grids disposed at opposing sides of a unit pixel included in the pixel array.

The second grid may be disposed between the first grids adjacent to each other in the row or column direction.

The second grid may abut the first grids adjacent in side-to-side and top-to-bottom directions.

The first grid may include an air layer filed with air and a first capping film covering the air layer.

The first capping film may have a refractive index higher than that of the air and lower than that of a color filer abutting the first grid.

The first grid may further include a second capping film covering the first capping film and having a larger thickness than the first capping film.

The first grid may further include a metal layer formed under the air layer and made of a metal.

The second grid may include a metal layer made of a metal and a first capping film disposed on the metal layer.

The metal layer of the second grid may physically isolate the air layers of the first grids adjacent to each other in the row or column direction.

The metal may be tungsten.

In an embodiment, an image sensor may include: a first grid formed between adjacent unit pixels included in a pixel array and extended along one side of each of the unit pixels; and a second grid disposed between the first grids adjacent to each other in a row or column direction of the pixel array.

BRIEF DESCRIPTION OF THE DRAWINGS

FIGS. 6A to 6I are diagrams for describing a process of forming a grid structure based on an embodiment of the disclosed technology.

DETAILED DESCRIPTION

Hereafter, various embodiments of the present disclosure will be described with reference to the accompanying drawings.

Figure 1:
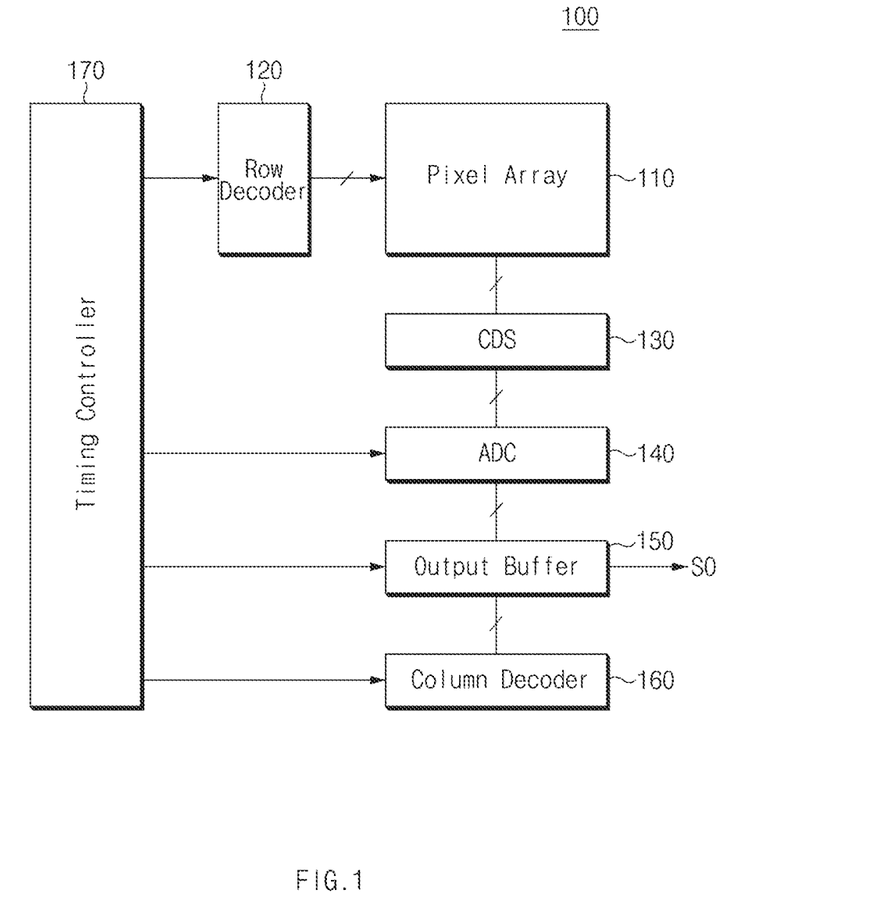
FIG. 1 is a block diagram illustrating an image sensor based on an embodiment of the disclosed technology.

FIG. 1 is a block diagram illustrating an image sensor based on an embodiment of the disclosed technology.

In some implementations, the image sensor 100 may include a pixel array 110, a row decoder 120, a correlate double sampler (CDS) 130, an analog-digital converter (ADC) 140, an output buffer 150, a column decoder 160 and a timing controller 170.

The pixel array 110 may include a plurality of unit pixels UP arranged in a two-dimensional manner. Each unit pixel may convert optical images into electrical signals. In some implementations, such conversion operations can be performed on a shared pixel basis in which two or more unit pixels share at least one element. The pixel array 110 may receive operating signals including row select signals, pixel reset signals, transmission signals from the row decoder 120. The pixel array 110 may be operated based on the operating signals.

The row decoder 120 may be used to select desired rows of the pixel array 110 based on control signals generated by the timing controller 170. The row decoder 120 may generate a row select signal for selecting one or more rows of the plurality of rows. In some implementations, the row decoder 120 may also sequentially enable pixel reset signals for resetting pixels and transmission signals for transmitting electrical signals generated by pixels corresponding to the selected one or more rows. Based on such transmission signals, analog reference signals and analog image signals generated from the respective pixels of the selected one or more rows may be sequentially transferred to the CDS 130. In this regard, the reference signal and the image signal may be collectively referred to as a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured.

In some embodiments of the disclosed technology, the CDS 130 may sequentially sample and hold the reference signals and the image signals applied to a plurality of column lines, respectively, from the pixel array 110. That is, the CDS 130 may sample and hold voltage levels of the reference signals and the image signals generated by the pixels corresponding to the respective columns of the pixel array 110.

The CDS 130 may transfer the reference signals and the image signals of the respective columns as correlate double sampling signals to the ADC 140 under control of the timing controller 170.

The ADC block is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may convert the correlate double sampling signals, outputted from the CDS 130 into digital signals on a column basis. In some implementations, the ADC 400 samples an input signal (e.g., pixel signal) multiple times using the reference signal and analog-to-digital convert the sampled input signals by counting the number of clock pulses until crossing points. The ADC 140 may perform such a counting operation based on the correlate double sampling signals for the respective columns and a ramp signal provided from the timing controller 170, thereby generating digital image data while minimizing noises corresponding to the respective columns such as intrinsic reset noises of the respective pixels.

The ADC 140 may include a plurality of column counters corresponding to the respective columns of the pixel array 110, and generate digital image data by converting the correlate double sampling signals corresponding to the respective columns into digital signals using the column counters. In another embodiment, the ADC 140 may include one global counter, and convert the correlate double sampling signals corresponding to the respective columns into digital signals using a global code provided from the global counter.

The output buffer 150 may capture column-based image data provided from the ADC 140, and output the captured image data. The output buffer 150 may temporarily store the image data outputted from the ADC 140 under control of the timing controller 170. The output buffer 150 may operate as an interface that compensates for data rate difference from another device coupled to the image sensor 100.

The column decoder 160 may be used to select a column of the output buffer 150 under control of the timing controller 170, such that the image data temporarily stored in the selected column of the output buffer 150 are sequentially outputted. In some implementations, the column decoder 160 may, based on an address signal from the timing controller 170, generate a column select signal for selecting a column of the output buffer 150 to output the image data of the selected column of the output buffer 150 as an output signal SO.

The timing controller 170 may control the row decoder 120, the ADC 140, the output buffer 150 and the column decoder 160.

The timing controller 170 may generate a clock signal required for the operations of the respective components of the image sensor 100, a control signal for timing control, and address signals for selecting a row or column, and provide the generated signals to the row decoder 120, the column decoder 160, the ADC 140 and the output buffer 150. In an embodiment, the timing controller 170 may include a logic control circuit, a phase locked loop (PLL), a timing control circuit, a communication interface circuit.

Figure 2:
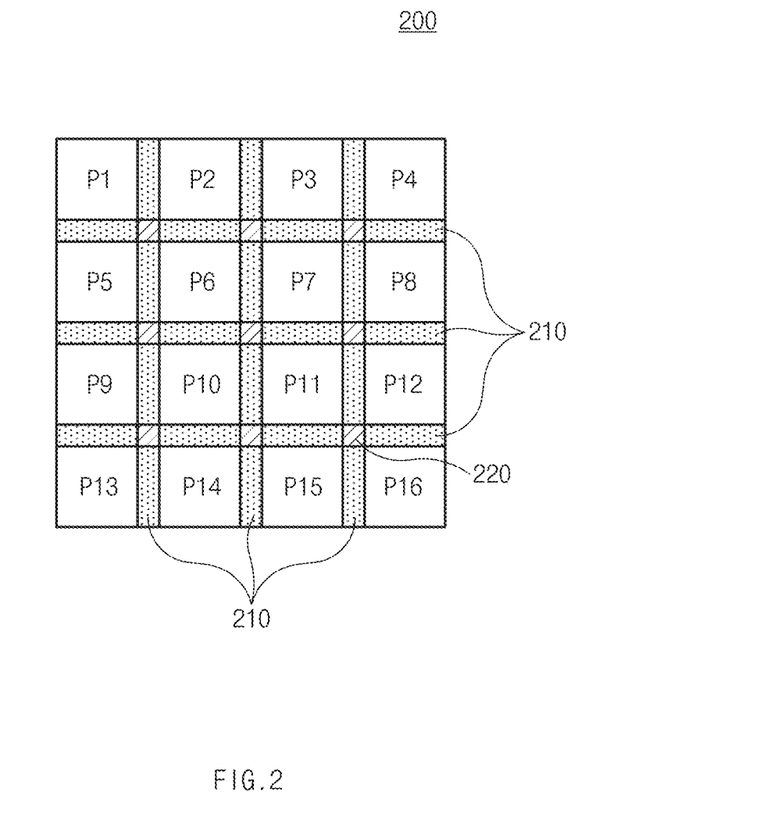
FIG. 2 is a diagram illustrating a part of a pixel array illustrated in FIG. 1.

FIG. 2 illustrates a sub-pixel array of the pixel array illustrated in FIG. 1.

In some implementations, the sub-pixel array 200 of the pixel array 110 may include 16 unit pixels P1 to P16 arranged in a 4×4 matrix. Although FIG. 2 illustrates the sub-pixel array as having only 16 unit pixels P1 to P16, each sub-pixel array can be implemented to have more than 16 unit pixels, and the pixel array 110 may include unit pixels arranged in a matrix of M rows and N columns, where M and N are random positive integers.

Each of the unit pixels P1 to P16 may include a first grid structure 210 and a second grid structure 220 to electrically and/or optically isolate the unit pixels from neighboring unit pixels.

The first grid structure 210 may be disposed between the pixels adjacent to each other in the row direction or in the column direction of the pixel array 100. For example, the first grid structure 210 is arranged along boundaries between adjacent rows of the pixels or boundaries between adjacent columns of the pixels. The pixel array 110 may include a plurality of first grid structures 210 arranged in the row or column direction of the pixel array 110. The first grid structure 210 may have a shape that extends along a side of each unit pixel. The first grid structure 210 may be defined as a component included in each pixel and arranged at the top side and bottom side and/or the left side and right side of each pixel. The first grid structure 210 may also be defined as a component for partitioning the pixel array into individual unit pixels. In some embodiments of the disclosed technology, the first grid structure 210 may include an air grid structure including low index material such as air therein.

The pixel array 110 may include a plurality of second grid structures 220. In some embodiments of the disclosed technology, each second grid structure 220 may be arranged at the center of 2×2 matrix of unit pixels. For example, as shown in FIG. 2, each second grid structure 220 is surrounded by four adjacent pixels (e.g., P6, P7, P10 and P11). In other words, each second grid structure 220 may be disposed at each intersection between the first grid structures 210 extending in the row direction and the column direction of the pixel array 110. In one example, the second grid structure 220 may be disposed in the area between the first grid structures adjacent to each other in the row direction (e.g., between the first grid structure disposed at the bottom of P6 and the first grid structure disposed at the bottom of P7) or the area between the first grid structures adjacent to each other in the column direction (e.g., between the first grid structure disposed at the right of P6 and the first grid structure disposed at the right of P10). In one example, the second grid structure 220 may be disposed at the area among four first grid structures (e.g., four first grid structures disposed at the right and bottom sides of P6 and disposed at the left and top sides of P11) such that the second grid structure 220 connects the four first grid structures 210. In other words, the second grid structures 220 may be disposed at the intersections between hypothetical lines along which the first grid structures 210 are arranged in the row direction (e.g., the first grid structure disposed at the bottom side of P6 and the first grid structure disposed at the bottom side of P7) and in the column direction (e.g., the first grid structure disposed at the right side of P6 and the first grid structure disposed at the right side of P10).

Figure 3:
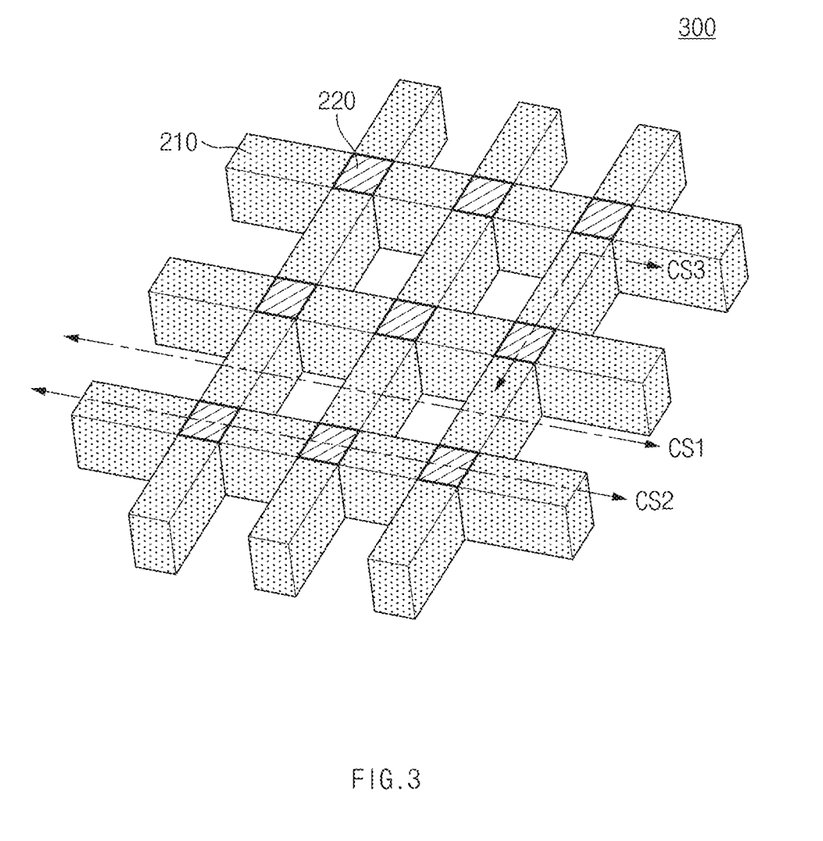
FIG. 3 is a perspective view of first and second grid structures illustrated in FIG. 2 based on some embodiments of the disclosed technology.

FIG. 3 is a perspective view of the first and second grid structures illustrated in FIG. 2 based on some embodiments of the disclosed technology.

By way of example FIG. 3 illustrates the first grid structures 210 and the second grid structures 220 as having the same width and height as each other. In another embodiment, the width and height of the first grid structures 210 may be different from the width and height of the second grid structures 220. Between the first grid structures 210 adjacent to each other, e.g., the first grid structures 210 disposed on the opposing sides of each unit pixel, a color filter of the corresponding unit pixel (e.g., red, green, blue, yellow) may be disposed.

In some implementations, a micro-lens may be disposed over the color filter to converge incident light into a photodetector (e.g., photodiode) of the corresponding pixel. In some implementations, a substrate may be disposed under the color filters, and in the substrate a plurality of photodiodes are disposed to convert incident light into electrical signals.

In most cases, the incident light having passed through the micro-lens and the color filter propagates toward the corresponding photodiode. In some cases, however, the incident light having passed through the color filter of a specific pixel may propagate to another pixel through an adjacent color filter, and this causes optical crosstalk between adjacent pixels, creating undesirable noise in pixel signals. In some embodiments of the disclosed technology, the first and second grid structures 210 and 220 may be used to prevent such optical crosstalk between adjacent pixels by reflecting or absorbing incident light into the corresponding pixel.

FIGS. 4A to 5B illustrate cross-sectional structures of the first and second grid structures 210 and 220 taken along lines CS1, CS2 and CS3 as illustrated in FIG. 3. FIGS. 6A to 6I illustrate a process for forming the first and second grid structures 210 and 220 based on cross-section views taken along the line CS3.

Figure 4A:
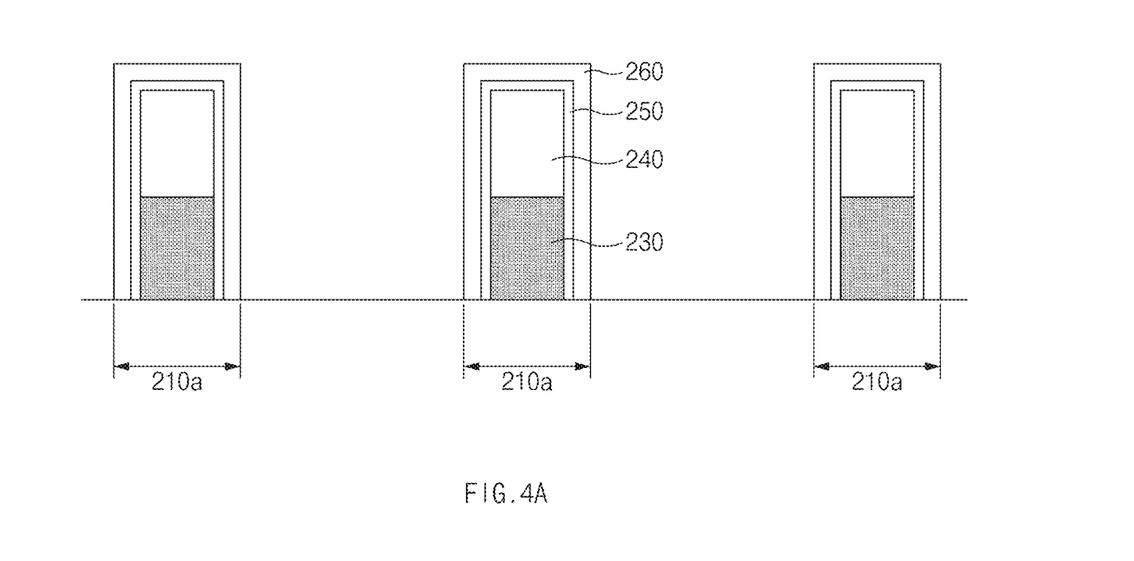
FIG. 4A is a diagram illustrating a cross-section of the first and second grid structures based on some embodiments of the disclosed technology.

FIG. 4A is a diagram illustrating a cross-section of the first and second grid structures based on some embodiments of the disclosed technology.

In some implementations, first grid structures 210a may be spaced apart from each other by the widths of the pixels (e.g., P10 and P11). As described above, the color filters of the respective pixels (e.g., P10 and P11) may be disposed over photodiodes arranged among the first grid structures 210a. In an implementation, the top surface of the color filter is placed higher than the height of the first grid structure 210a. In another implementation, the top surface of the color filter is placed lower than the height of the first grid structure 210a. In yet another implementation, the top surface of the color filter is placed at the same height as the first grid structure 210a.

In some embodiments of the disclosed technology, the first grid structure 210a may include a metal layer 230, an air layer 240 (or another low index material layer), a first capping film 250, and a second capping film 260. It is to be noted that the relative widths, heights and thicknesses of the components included in the first grid structure 210a are not be limited to those illustrated in FIG. 4A.

The metal layer 230 may be disposed on the substrate. The metal layer 230 may be made of a metallic material (for example, tungsten) having a high light absorption rate. In an embodiment, different materials may be stacked to form the metal layer 230.

The air layer 240 may be disposed on the metal layer 230, and have a shape defined by the first capping film 250. The air layer 240 may be an area filled with air that has a relatively low refractive index (e.g., 1).

The first capping film 250 may be formed to cover the air layer 240 and the metal layer 230. That is, the first capping film 250 is in contact with side surfaces of the air layer 240 and the metal layer 230 and the top surface of the air layer 240. Therefore, the air layer 240 and the metal layer 230 may be physically isolated from the outside by the first capping film 250. For example, the first capping film 250 may be an ULTO (ultra low temperature oxide) film such as silicon oxide ($SiO_2$).

The second capping film 260 may be formed to cover the first capping film 250. That is, one side surface of the second capping film 260 is in contact with the first capping film 250. Therefore, the first capping film 250 may be physically isolated from the outside by the second capping film 260. For example, the second capping film 260 may be a dielectric film including one or more of silicon oxynitride ($Si_xO_yN_z$), silicon oxide ($Si_xO_y$) and silicon nitride ($Si_xN_y$), where x, y and z are natural numbers.

The second capping film 260 may have a larger thickness than the first capping film 250. This is because the first capping film 250 is formed to have as small a thickness as possible, such that an internal material can be effectively discharged to the outside during a plasma process which will be described below, and the second capping film 260 is formed to have a thickness required for stably maintaining the shape of the first grid structure 210a including the air layer 240.

In another embodiment, a supporting film for maintaining the shape of the first grid structure 210a may be formed at the area corresponding to the bottom of the first capping film 250 and the top of the air layer 240. Such a supporting film may be a dielectric film having no light absorption property.

In an embodiment, the first capping film 250 and the second capping film 260 may be formed of the same material, and have the same or similar refractive index.

In an embodiment, the refractive indices of the first and second capping films 250 and 260 may be higher than that of the air layer 240 and lower than that of the color filter.

Figure 4B:
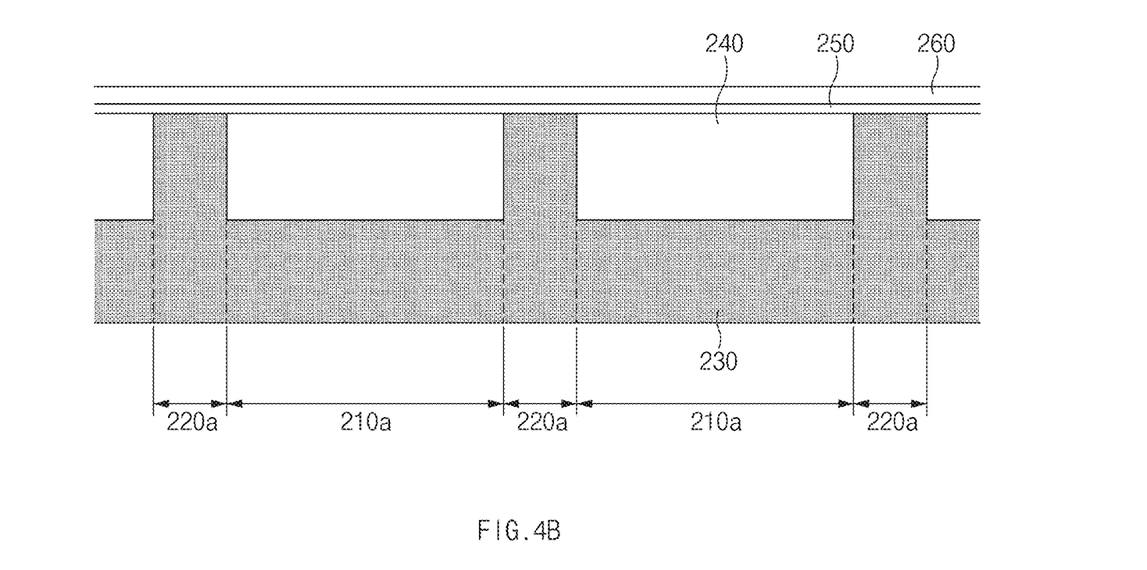
FIG. 4B is a diagram illustrating another cross-section of the first and second grid structures based on some embodiments of the disclosed technology.

FIG. 4B is a diagram illustrating another cross-section of the first and second grid structures based on some embodiments of the disclosed technology.

Referring to FIG. 4B, the first grid structures 210a and the second grid structures 220a may be alternately disposed along the line CS2.

The first grid structure 210a has the same structure as those shown in FIG. 4A, but FIG. 4B illustrates a cross-section taken along the longitudinal direction of the first grid structure 210a. That is, the cross-section taken along the line CS2 shows that the first grid structure 210a may have a structure in which the metal layer 230, the air layer 240, the first capping film 250 and the second capping film 260 are sequentially stacked.

The second grid structure 220a may have a structure in which the metal layer 230, the first capping film 250 and the second capping film 260 are sequentially stacked. That is, the second grid structure 220a may include no air layer 240.

The first grid structure 210a may block light incident on the color filter (not illustrated) from traveling to another color filter (not illustrated), thereby minimizing optical crosstalk.

In some implementations, since the refractive index (e.g., 1) of the air layer 240 filled with low index material such as air is lower than the refractive index (e.g., 1.6 to 1.7) of the color filter (not illustrated) and the refractive index (e.g., 1.4) of the first and second capping films 250 and 260, the air layer 240 may block light from passing through toward neighboring pixels.

Whether light is reflected at the boundary of the air layer 240 may depend on an incident angle of the light, and thus a portion of the light: at a certain incident angle may not be reflected and instead refracted toward the inside. Even in this case, however, the portion of the light may be absorbed by the metal layer 230, thereby preventing optical crosstalk.

As illustrated in FIG. 4B, the first grid structure 210a and the second grid structure 220a are successively disposed, and the first or second capping film 250 or 260 is not disposed between the first grid structure 210a and the second grid structure 220a along the line CS2.

As a result, in some embodiments of the disclosed technology, the air layers 240 of the first grid structures 210a adjacent to each other may be physically isolated from each other by the metal layer 230 of the second grid structure 220a.

Suppose that the first grid structures 210a are formed without forming the second grid structures such that all the first grid structures are connected and thus all the air layers of the first grid structures are connected, unlike the structure illustrated in FIG. 4B.

In this case, since the first and second capping films 250 and 260 are thin-film layers, an internal pressure cause by the expansion of the air layer can be concentrated at weak portions of the first and second capping films 250 and 260. The pressure concentrated at the weak portions of the first and second capping films 250 and 260 is increased as the temperature and volume of the internal air of the air layer 240 are increased. In the case of the above-described structure in which the entire air layers 240 of the pixel array 110 are connected, the internal pressure cause by the expansion of the entire air layers 240 can damage the weak portions of the first and second capping films 250 and 260.

However, the grid structure implemented based on some embodiments of the disclosed technology includes the second grid structures 220a, which are disposed at the respective intersections between the first grid structures 210a in the row direction and in the column direction and physically isolate the air layers 240 of the first grid structures 210a. Therefore, the pressure that otherwise would have been concentrated on the weak portions may be distributed across the grid structure, thereby preventing such collapse the first and second capping films 250 and 260.

Figure 5A:
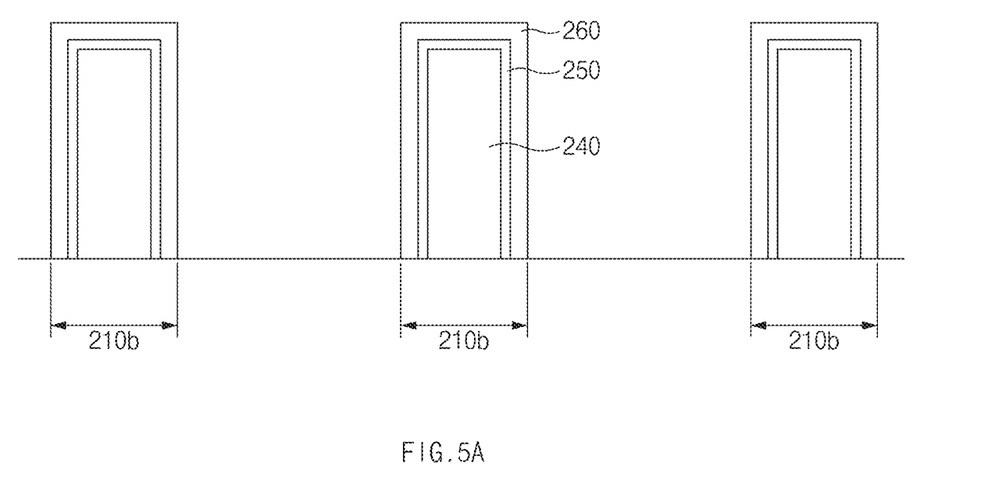
FIG. 5A is a diagram illustrating another cross-section of the first and second grid structures based on some embodiments of the disclosed technology.

FIG. 5A is a diagram illustrating another cross-section of the first and second grid structures based on some embodiments of the disclosed technology.

In some implementations, first grid structures 210b may be spaced apart from each other by the widths of the pixels (e.g., P10 and P11). As described above, the color filters of the respective pixels (e.g., P10 and P11) may be disposed over photodiodes arranged among the first grid structures 210b. In an implementation, the top surface of the color filter is placed higher that the height of the first grid structure 210b. In another implementation, the top surface of the color filter is placed lower than the height of the first grid structure 210b. In yet another implementation, the top surface of the color filter is placed at the same height as the first grid structure 210b.

In some embodiments of the disclosed technology, the first grid structure 210b may include the air layer 240 (or another low index material layer), the first capping film 250 and the second capping film 260. It is to be noted that the relative widths, heights and thicknesses of the components included in the first grid structure 210b are not limited to those illustrated in FIG. 5A.

The first grid structure 210b has a structure from which the metal layer 230 is omitted, unlike the first grid structure 210a illustrated in FIG. 4A. In one example the structures and materials of the air layer 240, the first capping film 250 and the second capping film 260 are similar or identical to those illustrated with reference to FIG. 4A.

In another embodiment, a supporting film for maintaining the shape of the first grid structure 210b may be formed at the area corresponding to the bottom of the first capping film 250 and the top of the air layer 240. Such a supporting film may be a dielectric film having no light absorption property.

Figure 5B:
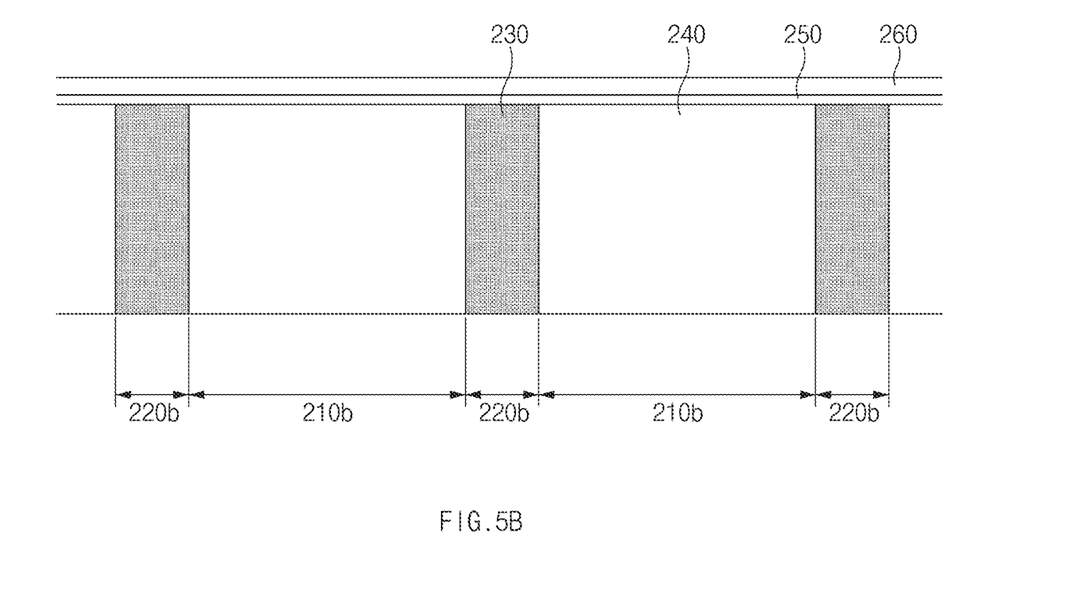
FIG. 5B is a diagram illustrating another cross-section of the first and second grid structures based on some embodiments of the disclosed technology.

FIG. 5B is a diagram illustrating another cross-section of the first and second grid structures based on some embodiments of the disclosed technology.

Referring to FIG. 5B, the first grid structures 210b and the second grid structures 220b may be alternately disposed along the line CS2.

The first grid structure 210b has the same structure as those shown in FIG. 5A, but FIG. 5B illustrates a cross-section taken along the longitudinal direction of the first grid structure 210b. That is, the cross-section taken along the line CS2 shows that the first grid structure 210b may have a structure in which the air layer 240, the first capping film 250 and the second capping film 260 are sequentially stacked.

The second grid structure 220b may have a structure in which the metal layer 230, the first capping film 250 and the second capping film 260 are sequentially stacked. That is, the second grid structure 220a may include no air layer 240.

The first grid structure 210b may block light incident on the color filter (not illustrated) from traveling to another color filter (not illustrated), thereby minimizing optical crosstalk.

In some implementations, since the refractive index (e.g., 1) of the air layer 240 filled with air is lower than the refractive index (e.g., 1.6 to 1.7) of the color filter (not illustrated) and the refractive index (e.g., 1.4) of the first and second capping films 250 and 260, the air layer 240 may block light from passing through toward neighboring pixels.

As illustrated in FIG. 5B, the first grid structure 210b and the second grid structure 220b are successively disposed, and the first or second capping film 250 or 260 is not disposed between the first grid structure 210b and the second grid structure 220b along the line CS2.

As a result, in some embodiments of the disclosed technology, the air layers 240 of the first grid structures 210b adjacent to each other may be physically isolated from each other by the metal layer 230 of the second grid structure 220b.

Suppose that the first grid structures 210b are formed without forming the second grid structures such that all the first grid structures are connected and thus all the air layers of the first grid structures are connected, unlike the structure illustrated in FIG. 5B.

In this case, since the first and second capping films 250 and 260 are thin-film layers, an internal pressure cause by the expansion of the air layer can be concentrated at weak portions of the first and second capping films 250 and 260. The pressure concentrated at the weak portions of the first and second capping films 250 and 260 is increased as the temperature and volume of the internal air of the air layer 240 are increased. In the case of the above-described structure in which the entire air layers 240 of the pixel array 110 are connected, the internal pressure cause by the expansion of the entire air layers 240 can damage the weak portions of the first and second capping films 250 and 260.

However, the grid structure implemented based on some embodiments of the disclosed technology includes the second grid structures 220b, which are disposed at the respective intersections between the first grid structures 210b in the row direction and in the column direction and physically isolate the air layers 240 of the first grid structures 210b. Therefore, the pressure that otherwise would have been concentrated on the weak portions may be distributed across the grid structure, thereby preventing such collapse the first and second capping films 250 and 260.

FIGS. 6A to 6I are diagrams for describing a process of forming a grid structure based on an embodiment of the disclosed technology.

Specifically, FIGS. 6A to 6I show processes of forming the first grid structure 210a including the metal layer 230 and the second grid structure 220a, which are illustrated in FIGS. 4A and 4B. Since a process of forming the first grid structure 210b with no metal layer 230 and the second grid structure 220b, which are illustrated in FIGS. 5A and 5B, is performed in substantially the same manner as the process of forming the first grid structure 210a with the metal layer 230 and the second grid structure 220a, except a process for the metal layer 230 of the first grid structure 210a, the detailed descriptions thereof will be omitted.

The cross-sections illustrated in FIG. 6A to FIG. 6I correspond to the cross-section taken along the line CS3 of FIG. 3.

Figure 6A:
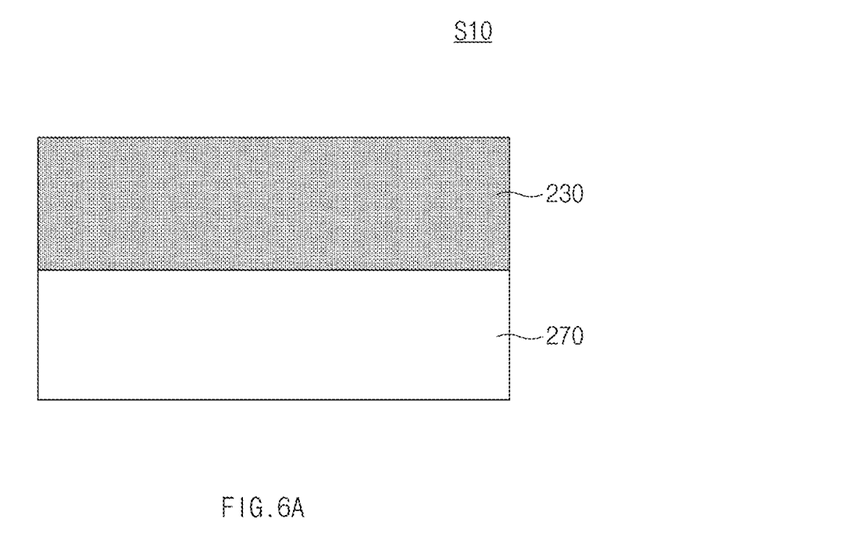

In step S10 of FIG. 6A, the metal layer 230 may be formed on a substrate 270 through a deposition process. The height of the metal layer 230 may correspond to the height of the metal layer 230 of the second grid structure 220a. For example, the substrate 270 may be a P-type or N-type bulk substrate, a substrate formed by growing a P-type or N-type epitaxial layer in a P-type bulk substrate, or a substrate formed by growing a P-type or N-type epitaxial layer in an N-type bulk substrate.

Figure 6B:
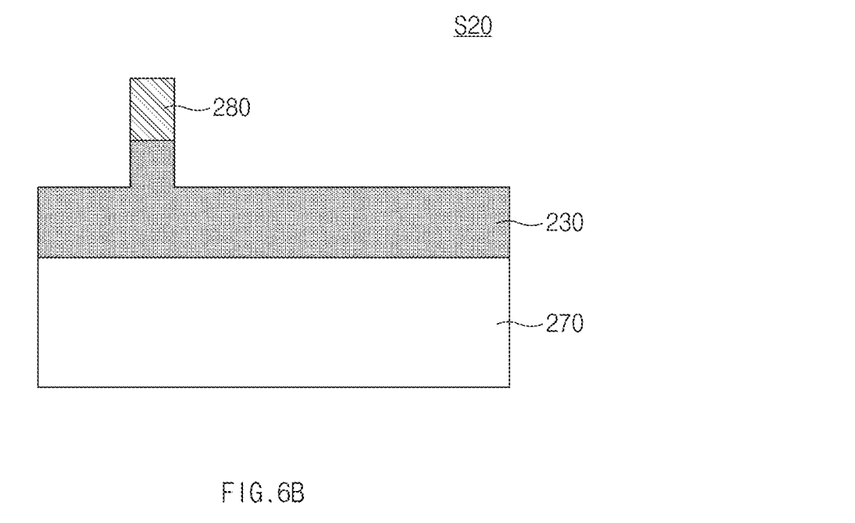

In step S20 of FIG. 6B, a first mask pattern 280 defining the second grid structure 220a may be disposed on the metal layer 230, and the metal layer 230 may be etched using the first mask pattern 280 as an etch mask. Thus, the metal layer 230 may have a structure in which the height of the metal layer 230 corresponding to the second grid structure 220a is larger than the height of the metal layer 230 corresponding to the first grid structure 210a. The etch depth of the metal layer 230 may be predetermined by the height of the metal layer 230 corresponding to the first grid structure 210a. The first mask pattern 280 and mask patterns which will be described below may include photoresist patterns.

Figure 6C:
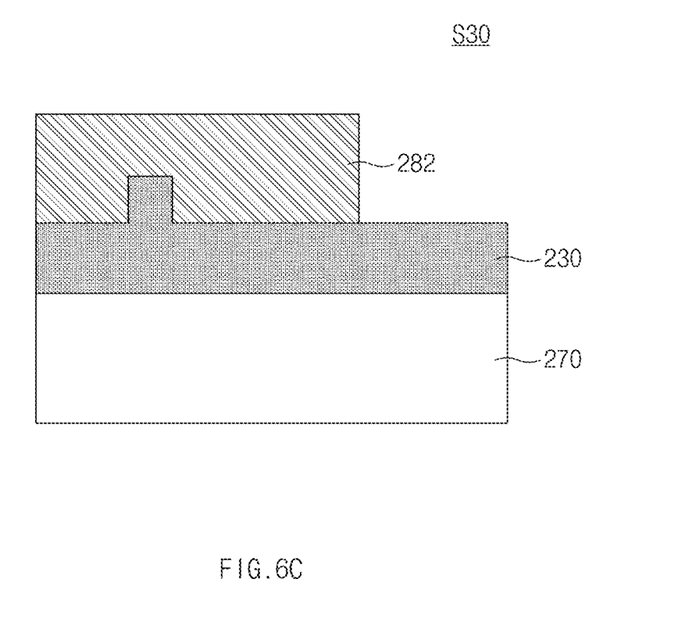

In step S30 of FIG. 6C, the first mask pattern 280 may be removed, and a second mask pattern 282 defining the first grid structure 210a and the second grid structure 220a may be disposed on the metal layer 230.

Figure 6D:
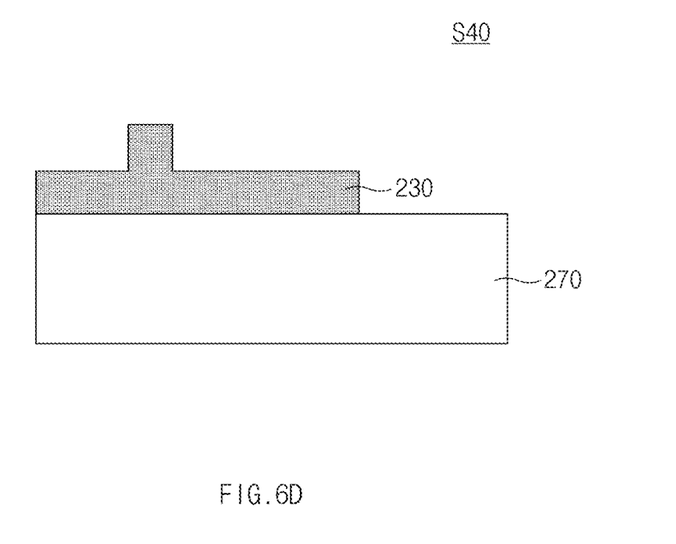

In step S40 of FIG. 6D, the metal layer 230 may be etched using the second mask pattern 282 as an etch mask. Thus, the metal layer 230 disposed in the area excluding the first and second grid structures 210a and 220a (for example, the unit pixel area) may be removed. Then, the second mask pattern 282 may be removed. In this way, the metal layer 230 included in each of the first and second grid structures 210a and 220a may be formed.

Figure 6E:
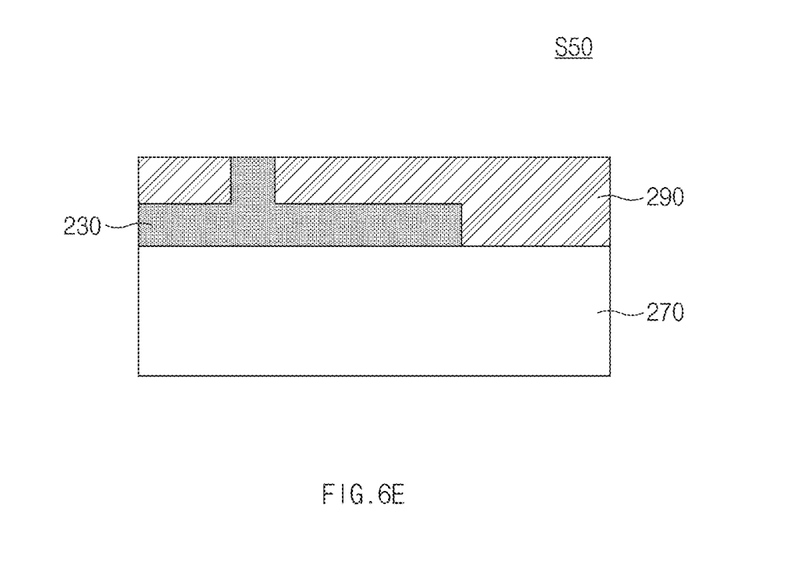

In step S50 of FIG. 6E, a sacrificial film 290 may be formed on the substrate 270 and the metal layer 230. The sacrificial film 290 may include an SOC (Spin On Carbon) film containing carbon. However, the sacrificial film 290 may be formed to have the same height as the height of the metal layer 230 of the second grid structure 220a. For this structure, an additional process may be performed so that the height of the sacrificial film 290 is similar or identical to the height of the metal layer 230 of the second grid structure 220a.

Although not illustrated in FIG. 6E, a buffer layer (not illustrated) may be formed between the substrate 270 or the metal layer 230 and the sacrificial film 290. The buffer layer may include a nitride film such as silicon nitride ($Si_xN_y$) or silicon oxynitride ($Si_xO_yN_z$) and an oxide film such as USG (undoped silicate glass) over the nitride film, where x, y and z are natural numbers. Before the sacrificial film 290 is formed, an anneal process may be performed on the nitride film and the oxide film under a nitrogen ($N_2$) atmosphere. In the following descriptions, the buffer layer (not illustrated) is omitted for convenience of description.

Figure 6F:
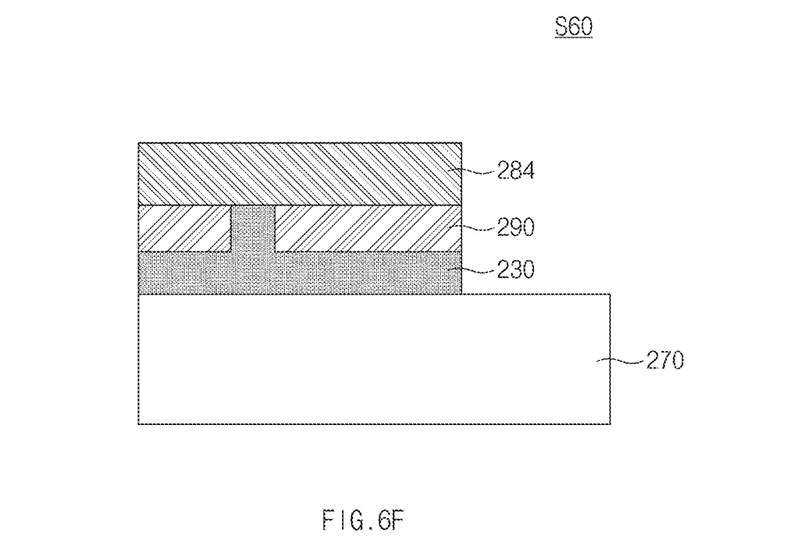

In step S60 of FIG. 6F, a third mask pattern 284 defining the first grid structure 210a and the second grid structure 220a may be disposed over the metal layer 230 and the sacrificial film 290.

Figure 6G:
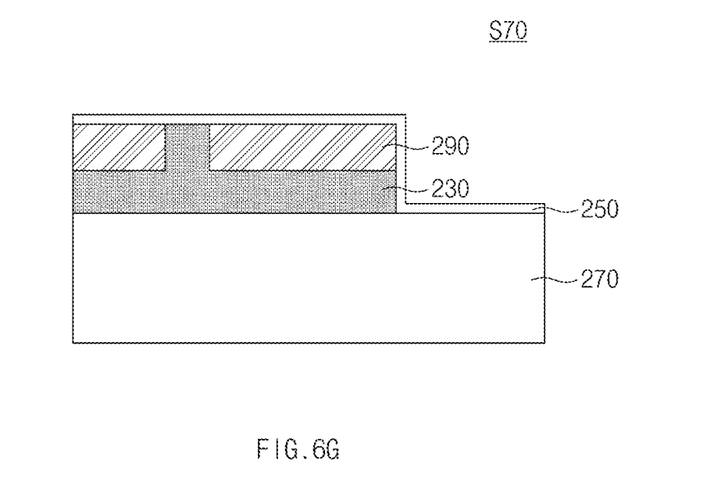

In step S70 of FIG. 6G, the sacrificial film 290 may be etched using the third mask pattern 284 as an etch mask. Thus, the sacrificial film 290 disposed in the area excluding the first and second grid structures 210a and 220a (for example, the unit pixel area) may be removed. Then, the third mask pattern 284 may be removed. In this way, the sacrificial film 290 corresponding to the shape of the air layer 240 included in each of the first and second grid structures 210a and 220a may be formed.

Then, the first capping film 250 may be formed over the substrate 270, the sacrificial film 290 and the metal layer 230 through a deposition process. The first capping film 250 may include oxide such as ULTO. The first capping film 250 may be thin enough for molecules produced through bonding between gas used during a subsequent plasma process and carbon of the sacrificial film 290 to easily escape to the outside. For example, the first capping film 250 may be formed to have a thickness of 300 Å or less.

Figure 6H:
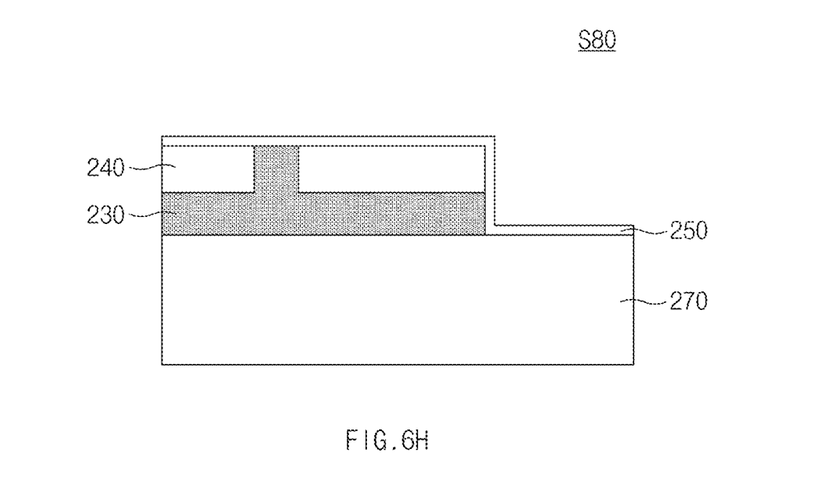

In step S80 of FIG. 6H, a plasma process may be performed to remove the sacrificial film 290, after the first capping film 250 is formed, and the air layer 240 may be formed at the position from which the sacrificial film 290 is removed. In one example, the plasma process may be a plasma process using gas, such as $O_2$, $N_2$, $H_2$, CO, $CO_2$ or $CH_4$, including one or more of oxygen, nitrogen and hydrogen. Here, the $O_2$ plasma process will be taken as an example and described in more detail as follows. Oxygen radicals O* are introduced into the sacrificial film 290 through the first capping film 250, and then bonded to carbon of the sacrificial film 290 to produce CO or $CO_2$. The produced CO or $CO_2$ escapes to the outside through the first capping film 250. Through such a process, the sacrificial film 290 may be removed, and the air layer 240 may be formed at the position from which the sacrificial film 290 is removed.

In an embodiment, in order to prevent a collapse of the first capping film 250 that can occur while the sacrificial film 290 is being removed, the plasma process may be performed with a supporting film (not illustrated), such as an oxide film, formed on the sacrificial film 290.

In step S90 of FIG. 6I, the second capping film 260 may be formed on the first capping film 250 through a deposition process after the plasma process is completed. For example, the second capping film 260 may be a dielectric film including one or more of silicon oxynitride ($Si_xO_yN_z$), silicon oxide ($Si_3O_y$) and silicon nitride ($Si_xN_y$) where x, y and z are natural numbers. The thickness of the second capping film 260 may be larger than that of the first capping film 250, and the second capping film 260 may be formed to have a thickness required for stably maintaining the shape of the first grid structure 210a.

In FIGS. 6H and 6I, the first and second capping films 250 and 260 may be stacked and disposed along the top of the substrate 270. In FIGS. 4A and 5A, however, the first and second capping films 250 and 260 over the substrate 270 are omitted, for convenience of description.

In some embodiments of the disclosed technology, the grid structure may effectively prevent potential damages caused by the expansion of the air layer by arranging second grid structures between adjacent first grid structures. In this way, the pressure that otherwise would have been concentrated on the weak portions of the grid structure may be distributed across the grid structure, thereby preventing undesirable damages.

What is claimed is:

1. An image sensor comprising:
a plurality of first grid structures arranged in row and column directions of a pixel array of imaging pixels and structured to separate the imaging pixels from one another, each of the first grid structures including an air layer filled with air to provide optical isolation between two adjacent imaging pixels; and
a plurality of second grid structures respectively disposed at each intersection between the row direction and the column direction in which the first grid structures are arranged,
wherein each first grid structure further comprises a metal layer formed under the air layer and including a metal,
wherein the second grid structure comprises a metal layer including a metal,
wherein the metal layer of the second grid structure physically isolates air layers of the first grid structures adjacent to each other in the row or column direction,
wherein the metal layer of the second grid structure has a higher height than the metal layer of the first grid structure.

2. The image sensor of claim 1, wherein each of the first grid structures arranged along one side of each unit pixel corresponding to each of the first grid structures.

3. The image sensor of claim 1, further comprising a plurality of color filters, wherein each of the plurality of color filters is disposed between the first grid structures disposed at opposing sides of each unit pixel included in the pixel array.

4. The image sensor of claim 1, wherein each second grid structure is disposed between at least two adjacent first grid structures arranged in the row or column direction.

5. The image sensor of claim 1, wherein each second grid structure is in contact with at least two first grid structures adjacent in the row or column direction.

6. The image sensor of claim 1, wherein each first grid structure further comprises a first capping film covering the air layer.

7. The image sensor of claim 6, wherein the first capping film has a refractive index higher than that of the air and lower than that of a color filter abutting the first grid structure.

8. The image sensor of claim 6, wherein the first grid structure further comprises a second capping film covering the first capping film and having a larger thickness than the first capping film.

9. The imager sensor of claim 8, wherein the second capping film includes a silicon oxynitride (SixOyNz), silicon oxide (SixOy) or silicon nitride (SixNy), where x, y and z are natural numbers.

10. The imager sensor of claim 6, wherein the first capping film includes silicon oxide.

11. The image sensor of claim 1, wherein the second grid structure further comprises a first capping film disposed on the metal layer.

12. The image sensor of claim 11, wherein the metal is tungsten.

13. An image sensor comprising:
a substrate;
a pixel array formed on the substrate and including an array of unit pixels in row and columns, each unit pixel operable to convert light into a pixel signal;
a plurality of first grid structures formed over the substrate and located between adjacent unit pixels of the pixel array and extended along rows and columns of the unit pixels to separate adjacent unit pixels from one another, each first grid structure including an air layer filled with air to provide optical isolation between two adjacent unit pixels; and
a second grid structure formed over the substrate and disposed between the first grid structures adjacent to each other,
wherein each first grid structure further comprises a metal layer formed under the air layer and including a metal,
wherein the second grid structure comprises a metal layer including a metal,
wherein the metal layer of the second grid structure physically isolates air layers of the first grid structures adjacent to each other in the row or column direction,
wherein the metal layer of the second grid structure has a higher height than the meta layer of the first grid structure.

14. The image sensor of claim 13, wherein the second grid structure is in contact with at least two first grid structures adjacent in the row or column direction.

15. The image sensor of claim 13, wherein each first grid structure further comprises a first capping film covering the air layer.

16. The image sensor of claim 15, wherein the first capping film has a refractive index higher than that of the air and lower than that of a color filter abutting the first grid structure.

17. The image sensor of claim 15, wherein the first grid structure further comprises a second capping film covering the first capping film and having a larger thickness than the first capping film.

18. The imager sensor of claim 17, wherein the second capping film includes a silicon oxynitride (SixOyNz), silicon oxide (SixOy) or silicon nitride (SixNy), where x, y and z are natural numbers.

19. The imager sensor of claim 15, wherein the first capping film includes silicon oxide.

20. The image sensor of claim 13, wherein the second grid structure further comprises a first capping film disposed on the metal layer.

* * * * *